(12) United States Patent
Ha et al.

(10) Patent No.: US 7,489,585 B2
(45) Date of Patent: Feb. 10, 2009

(54) GLOBAL SIGNAL DRIVER FOR INDIVIDUALLY ADJUSTING DRIVING STRENGTH OF EACH MEMORY BANK

(75) Inventors: Sung-Joo Ha, Kyoungki-do (KR); Yong-Mi Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 134 days.

(21) Appl. No.: 11/478,117

(22) Filed: Jun. 30, 2006

(65) Prior Publication Data

US 2007/0070775 A1 Mar. 29, 2007

(30) Foreign Application Priority Data

Sep. 29, 2005 (KR) .................. 10-2005-0091547
Dec. 16, 2005 (KR) .................. 10-2005-0124651

(51) Int. Cl.
*G11C 8/00* (2006.01)
(52) U.S. Cl. .................. 365/230.06; 365/230.03
(58) Field of Classification Search ............ 365/230.01, 365/230.03, 230.06, 230.03 X, 230.06 O
See application file for complete search history.

(56) References Cited

U.S. PATENT DOCUMENTS

| | | | |
|---|---|---|---|
| 6,215,751 B1 | 4/2001 | Tsuchinaga | |
| 6,378,102 B1 | 4/2002 | Watanabe et al. | |
| 6,385,121 B2 | 5/2002 | Lee | |
| 6,894,547 B2 * | 5/2005 | Takahashi | 327/170 |
| 6,903,956 B2 * | 6/2005 | Sekino | 365/63 |
| 7,039,822 B2 * | 5/2006 | Faue et al. | 713/400 |

FOREIGN PATENT DOCUMENTS

| | | |
|---|---|---|
| JP | 10-40683 A | 2/1998 |
| KR | 10-2000-0065752 | 11/2000 |

OTHER PUBLICATIONS

Korean Office Action, Issued in Corresponding Korean Patent Application No. KR 10-2005-0124651, dated on Jun. 27, 2007.

* cited by examiner

*Primary Examiner*—VanThu Nguyen
(74) *Attorney, Agent, or Firm*—McDermott Will & Emery LLP

(57) ABSTRACT

A global signal driving device includes a driving control unit for generating a plurality of driving control signals differently configured according to transmission distances of a global signal to a plurality of banks by decoding a bank address; and a driving unit for adjusting a driving strength for driving the global signal based on the plurality of driving control signals in order to drive the global signal to the plurality of banks.

16 Claims, 5 Drawing Sheets

GLOBAL SIGNAL DRIVER FOR INDIVIDUALLY ADJUSTING DRIVING STRENGTH OF EACH MEMORY BANK

FIELD OF THE INVENTION

The present invention relates to a global signal driving device; and, more particularly, to a global signal driving device for individually adjusting a driving strength of a global signal driver for each bank by using a bank address in order to reduce a skew of a global signal among banks.

DESCRIPTION OF RELATED ARTS

As operational frequency and memory capacitance of a semiconductor memory device, particularly, a synchronous dynamic random access memory (SDRAM), are increased, a chip size of the SDRAM is increased. Accordingly, it is more difficult to secure a margin between signals due to a skew of a global signal among banks. Therefore, performance of the SDRAM is degraded.

FIG. 1 is a block diagram showing a conventional global signal driving device for use in a semiconductor memory device.

As shown, the conventional global signal driving device includes an input buffer 10, a data control unit 20, an address/command control unit 30, a driving unit 40 and a bank 50.

The input buffer 10 buffers a data signal DATA, a command signal CMD and an address signal ADD and outputs the buffered signals. The data control unit 20 controls the buffered data signal output from the input buffer 10 and outputs the controlled data signal. The address/command control unit 30 controls the buffered address signal and the buffered command signals output from the input buffer 10 and outputs the controlled signals.

The driving unit 40 drives a data output from the data control unit 20, an address signal and a command signal output from the address/command control unit 30 to thereby generate data D, a command signal C and a bank control signal BC. Herein, the data D, the command signal C and the bank control signal BC output from the driving unit 40 are called global signals. Operation of the bank 50 is controlled by the data D, the command signal C and the bank control signal BC output from the driving unit 40.

However, according to the conventional global signal driving device, a size of the driving unit 40 is determined on the basis of the farthest distance among distances from the driving unit 40 to banks. Accordingly, a same-sized driving unit is used for all cases.

For instance, as shown in FIG. 2, a first driving unit 41 is located near first and second banks BANK0 and BANK1 to drive a first global signal GS1 and a second driving unit 42 is located near seventh and eighth banks BANK6 and BANK7 to drive a second global signal GS2. Therefore, a delay time for the first global signal GS1 to reach the first and the second banks BANK0 and BANK1 is shorter than that for the first global signal GS1 to reach the seventh and the eighth banks BANK6 and BANK7. On the other hand, a delay time for the second global signal GS2 to reach the seventh and the eighth banks BANK6 and BANK7 is shorter than that for the second global signal GS2 to reach the first and the second banks BANK0 and BANK1.

If it is assumed that the second global signal GS2 should be a high level at a high level period of the first global signal GS1, since the two signals are in the opposite skewing directions at each bank, it is difficult to secure a margin between the first and the second global signals GS1 and GS2. As shown in FIG. 3, if a skew is greater than a simulated result, the above-mentioned operation fails (A), i.e., the second global signal GS2 deviates from the high level period of the first global signal GS1 at the first bank BANK0.

Further, since the same sized driver for driving the global signal to the farthest bank is also used for driving the global signal to a nearby bank, a power consumption is increased.

SUMMARY OF THE INVENTION

It is, therefore, an object of the present invention to provide a global signal driving device for reducing power consumption for driving a global signal and for reducing a signal skew among banks by individually adjusting a driver size according to a transmission distance of the global signal by using an input bank address.

In accordance with an aspect of the present invention, there is provided a global signal driving device, including: a driving control unit for generating a plurality of driving control signals differently configured according to transmission distances of a global signal to a plurality of banks by decoding a bank address; and a driving unit for adjusting a driving strength for driving the global signal based on the plurality of driving control signals in order to drive the global signal to the plurality of banks.

In accordance with an aspect of the present invention, there is provided a semiconductor memory device, including: a plurality of banks; a bank selecting unit for selecting at least one bank in response to a bank address; and a bank control signal driver for generating a bank control signal having a driving ability based on a selection by the bank selecting unit.

In accordance with an aspect of the present invention, there is provided a method for operating a semiconductor memory device, including: selecting at least one bank of a plurality of banks; generating a bank control signal for controlling the banks; adjusting a driving ability of the bank control signal based on the selected bank; transferring the adjusted bank control signal into the selected bank.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a global signal driving device in accordance with the present invention will be described in detail referring to the accompanying drawings.

Figure 4:
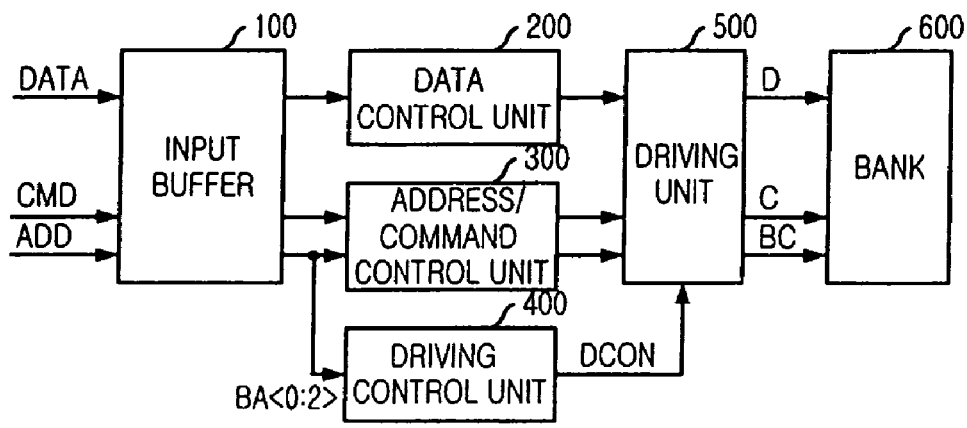
FIG. 4 is a block diagram of a global signal driving device in accordance with a preferred embodiment of the present invention.

FIG. 4 is a block diagram of a global signal driving device in accordance with a preferred embodiment of the present invention.

As shown, the global signal driving device includes an input buffer 100, a data control unit 200, an address/command control unit 300, a driving control unit 400, a driving unit 500 and a bank 600.

The input buffer 100 buffers a data signal DATA, a command signal CMD and an address signal ADD and outputs the buffered signals. The data control unit 200 controls the buffered data signal output from the input buffer 100 and outputs the controlled data signal. The address/command control unit 300 controls the buffered address signal and the buffered command signals output from the input buffer 100 and outputs the controlled signals.

The driving control unit 400 generates a plurality of driving control signals DCON having different values according to a position of a bank by using a bank address signal BA<0:2> among the buffered address signal output from the input buffer 100. The driving unit 500 drives data output from the data control unit 200, an address signal and a command signal output from the address/command control unit 300 having a driving strength determined by the plurality of driving control signals DCON to thereby output data D, a command signal C and a bank control signal BC to the bank 600.

Herein, the data D, the command signal C and the bank control signal BC output from the driving unit 500 are called global signals. An operation of the bank 600 is controlled by the data D, the command signal C and the bank control signal BC output from the driving unit 500.

Figure 5:
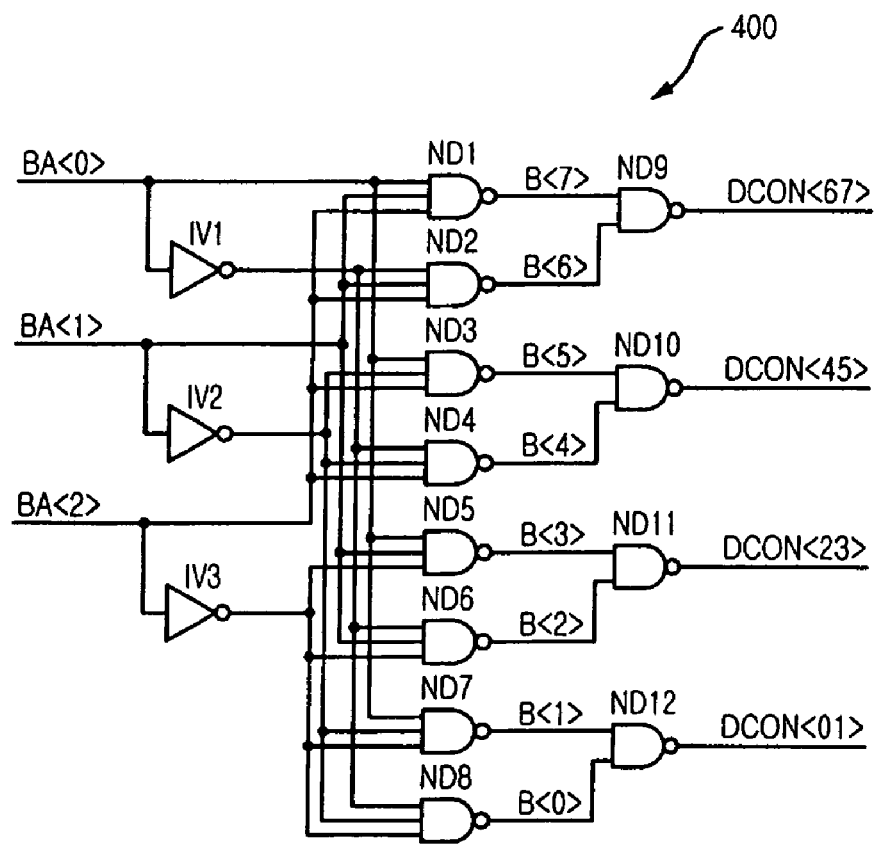
FIG. 5 is a schematic circuit diagram of the driving control unit shown in FIG. 4.

FIG. 5 is a schematic circuit diagram of the driving control unit 400 shown in FIG. 4.

As shown, the driving control unit 400 includes a first to a third inverters IV1 to IV3 and a first to a twelfth NAND gates ND1 to ND12.

The first NAND gate ND1 performs a logic NAND operation to bank addresses BA<0>, BA<1> and BA<2> to generate an eighth bank selection signal B<7>. The second NAND gate ND2 performs a logic NAND operation to an inverted version of the bank address BA<0> inverted by the first inverter IV1 and the bank addresses BA<1> and BA<2> to thereby generate a seventh bank selection signal B<6>. The third NAND gate ND3 performs a logic NAND operation to the bank addresses BA<0> and BA<2> and an inverted version of the bank address BA<1> inverted by the second inverter IV2 to thereby generate a sixth bank selection signal B<5>.

The fourth NAND gate ND4 performs a logic NAND operation to the bank address BA<2> and the inverted versions of the bank addresses BA<0> and BA<1> to thereby generate a fifth bank selection signal B<4>. The fifth NAND gate ND5 performs a logic NAND operation to the bank addresses BA<0> and BA<1> and an inverted version of the bank address BA<2> inverted by the third inverter IV3 to thereby generate a fourth bank selection signal B<3>. The sixth NAND gate ND6 performs a logic NAND operation to the bank address BA<1> and the inverted versions of the bank addresses BA<0> and BA<2> to thereby generate a third bank selection signal B<2>.

The seventh NAND gate ND7 performs a logic NAND operation to the bank address BA<0> and the inverted versions of the bank addresses BA<1> and BA<2> to thereby generate a second bank selection signal B<1>. The eighth NAND gate ND8 performs a logic NAND operation to the inverted versions of the bank addresses BA<0>, BA<1> and BA<2> to thereby generate a first bank selection signal B<0>.

The ninth NAND gate ND9 performs a logic NAND operation to the seventh and the eighth bank selection signals B<6> and B<7> to thereby generate a fourth driving control signal DCON<67>. The tenth NAND gate ND10 performs a logic NAND operation to the fifth and the sixth bank selection signals B<4> and B<5> to thereby generate a third driving control signal DCON<45>.

The eleventh NAND gate ND11 performs a logic NAND operation to the third and the fourth bank selection signals B<2> and B<3> to thereby generate a second driving control signal DCON<23>. The twelfth NAND gate ND12 performs a logic NAND operation to the first and the second bank selection signals B<0> and B<1> to thereby generate a first driving control signal DCON<01>.

Figure 6:
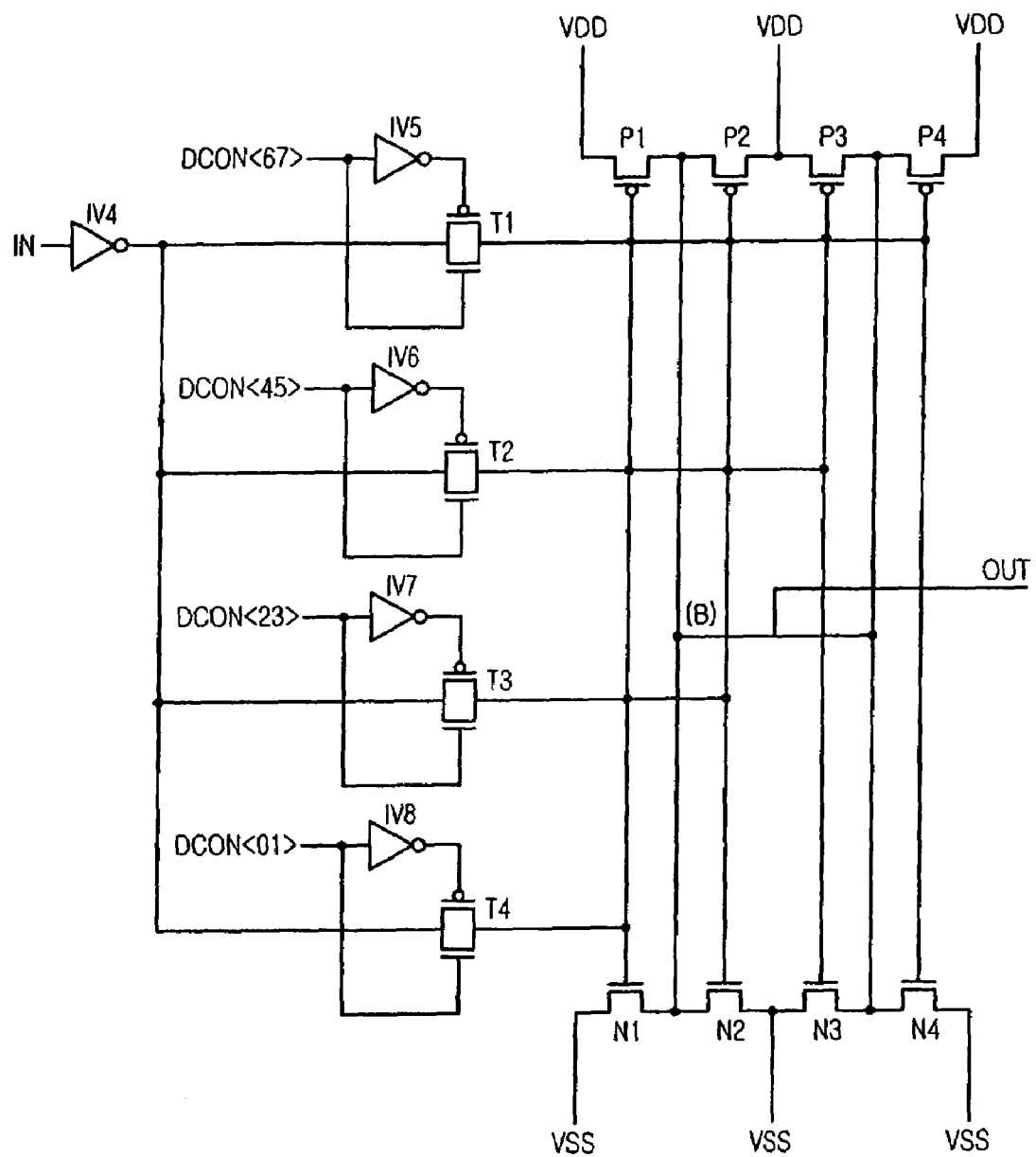
FIG. 6 is a schematic circuit diagram of the driving unit shown in FIG. 4.

FIG. 6 is a schematic circuit diagram of the driving unit 500 shown in FIG. 4.

Referring to FIG. 6, the driving unit 500 includes a fourth to an eighth inverters IV4 to IV8, a first to a fourth transfer gates T1 to T4 and a power supply unit. Herein, the power supply unit includes a first to a fourth p-type metal oxide semiconductor (PMOS) transistors P1 to P4 and a first to a fourth n-type metal oxide semiconductor (NMOS) transistors N1 to N4.

The first transfer gate T1 selectively passes an inverted version of an input signal IN inverted by the fourth inverter IV4 according to the fourth driving control signal DCON<67> and an inverted version of the fourth driving control signal DCON<67> inverted by the fifth inverter IV5. The second transfer gate T2 selectively passes the inverted version of the input signal IN according to the third driving control signal DCON<45> and an inverted version of the fourth driving control signal DCON<45> inverted by the sixth inverter IV6.

The third transfer gate T3 selectively passes the inverted version of the input signal IN according to the second driving control signal DCON<23> and an inverted version of the second driving control signal DCON<23> inverted by the seventh inverter IV7. The fourth transfer gate T4 selectively passes the inverted version of the input signal IN according to the first driving control signal DCON<01> and an inverted version of the first driving control signal DCON<01> inverted by the eighth inverter IV8.

The first to the fourth PMOS transistors P1 to P4 are connected in parallel between a power supply voltage VDD to receive outputs of the first to the fourth transfer gates T1 to T4 through gates of the first to the fourth PMOS transistors P1 to P4. Herein, an output terminal of the first transfer gate T1 is coupled to each gate of the first to the fourth PMOS transistors P1 to P4; an output terminal of the second transfer gate T2 is coupled to each gate of the first to the third PMOS transistors P1 to P3; an output terminal of the third transfer gate T3 is coupled to each gate of the first and the second PMOS transistors P1 and P2; and an output of the fourth transfer gate T4 is coupled to a gate of the first PMOS transistor P1.

The first to the fourth NMOS transistors N1 to N4 are connected in parallel between a ground voltage VSS to receive the outputs of the first to the fourth transfer gates T1 to T4 through gates of the first to the fourth NMOS transistors N1 to N4. Herein, the output terminal of the first transfer gate T1 is coupled to each gate of the first to the fourth NMOS transistors N1 to N4; the output terminal of the second transfer gate T2 is coupled to each gate of the first to the third NMOS transistors N1 to N3; the output terminal of the third transfer gate T3 is coupled to each gate of the first and the second NMOS transistors N1 and N2; and the output of the fourth transfer gate T4 is coupled to a gate of the first NMOS transistor N1.

The input signal IN indicates a data output from the data control unit 200, an address and a command signal output from the address/command control unit 300. An output signal OUT output from a node B indicates the bank control signal BC input to the bank 600.

Referring to FIGS. 4 to 6, an operation of the global signal driving device is described below.

Figure 1:
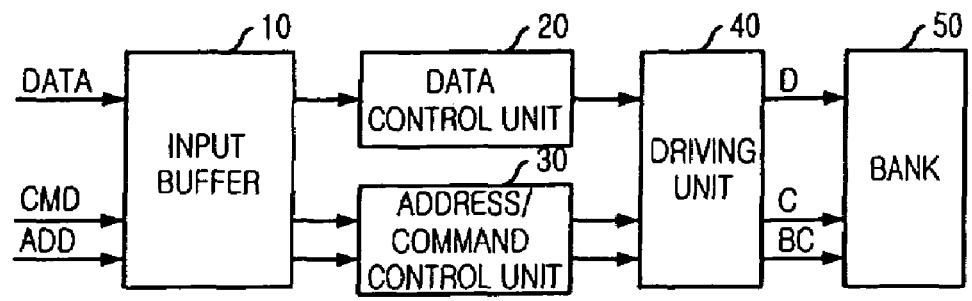
FIG. 1 is a block diagram of a conventional global signal driving device for use in a semiconductor memory device.
Figure 2:
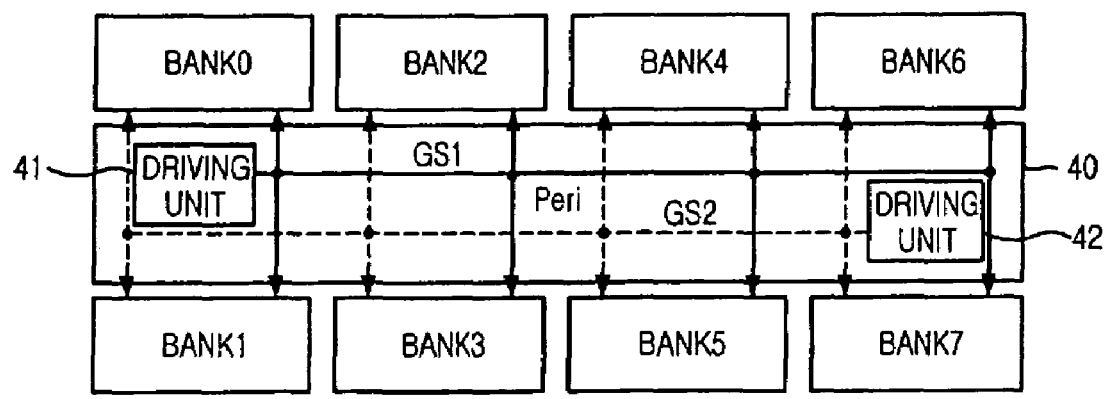
FIG. 2 is a block diagram showing signal skews among banks included in the semiconductor memory device shown in FIG. 1.
Figure 3:
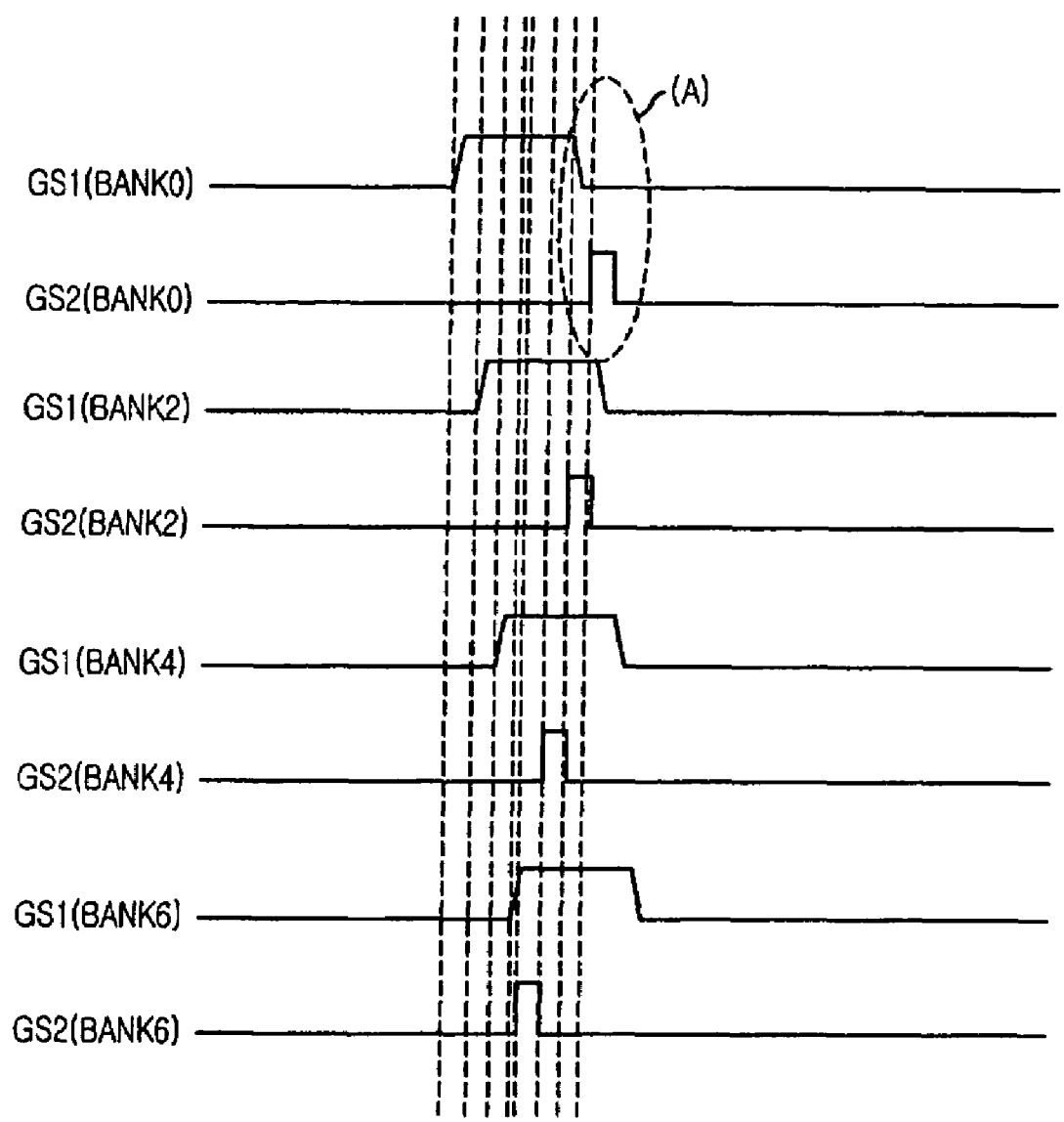
FIG. 3 is a waveform diagram for operation of the conventional global signal driving device shown in FIG. 1.

Herein, it is assumed that 8 banks are arranged as shown in FIG. 2 and each pair of the first and the second banks BANK0 and BANK1, the third and the fourth banks BANK2 and BANK3, the fifth and the sixth banks BANK4 and BANK5 and the seventh and the eighth banks BANK6 and BANK7 has the same skew.

The driving control unit 400 decodes the bank address BA<0:2> among the buffered address output from the input buffer 100 in order to generate the first to the fourth driving control signals DCON<01> to DCON<67> having different values. That is, if the input bank address BA<0:2> is 000 (BANK0) or 001(BANK1), the driving control unit 400 outputs the first driving control signal DCON<01> as a high level. In the same manner, the driving control unit 400 outputs the second driving control signal DCON<23> as a high level if the bank address BA<0:2> is 010(BANK2) or 011 (BANK3). Likewise, the driving control unit 400 outputs the third driving control signal DCON<45> as a high level if the bank address BA<0:2> is 100(BANK4) or 101(BANK5). If the bank address BA<0:2> is 110(BANK6) or 111(BANK7), the driving control unit 400 outputs the fourth driving control signal DCON<67> as a high level.

The driving unit 500 shown in FIG. 6 corresponds to the driving unit 41 shown in FIG. 2. That is, the first and the second banks BANK0 and BANK1 are the nearest to the driving unit 500 and the seventh and the eighth banks BANK6 and BANK7 are the farthest to the driving unit 500.

In this case, for the driving unit 500 to drive the data D, the command signal C and the bank control signal BC to the seventh and eighth banks BANK6 and BANK7, the fourth driving control signal DCON<67> becomes a high level. For this operation, the first transfer gate T1 among the first to the fourth transfer gates T1 to T4 is turned on and, thus, the input signal IN output from the data control unit 200 and the address/command control unit 300 is input to all of the first to the fourth PMOS transistors P1 to P4 and the first to the fourth NMOS transistors N1 to N4. Accordingly, since the first to the fourth PMOS transistors P1 to P4 or the first to the fourth NMOS transistors N1 to N4 are turned on, the data D, the command signal C and the bank control signal BC are driven to the banks BANK6 and BANK7 by the driving unit 500 having a maximum driving strength.

On the other hand, when the driving unit 500 drives the data D, the command signal C and the bank control signal BC to the fifth and the sixth banks BANK4 and BANK5, the third driving control signal DCON<45> is a high level. In this case, the second transfer gate T2 is turned on and, thus, the input signal IN is input to the first to the third PMOS transistors P1 to P3 and the first to the third NMOS transistors N1 to N3. Accordingly, since the first to the third PMOS transistors P1 to P3 or the first to the third NMOS transistors N1 to N3 are turned on, the data D, the command signal C and the bank control signal BC are driven to the banks BANK4 and BANK5 with a weaker driving strength than the maximum driving strength.

In the same manner, when the driving unit 500 drives the data D, the command signal C and the bank control signal BC to the third and the fourth banks BANK2 and BANK3, the second driving control signal DCON<23> is a high level. In this case, the third transfer gate T3 is turned on and, thus, the input signal IN is input to the first and the second PMOS transistors P1 and P2 and the first and the second NMOS transistors N1 and N2. Accordingly, the first and the second PMOS transistors P1 and P2 or the first and the second NMOS transistors N1 and N2 are turned on so that the data D, the command signal C and the bank control signal BC are driven to the banks BANK2 and BANK3 with a stronger driving strength than a driving strength used for driving those signals to the banks BANK0 and BANK1.

When the driving unit 500 drives the data D, the command signal C and the bank control signal BC to the first and the second banks BANK0 and BANK1, the first driving control signal DCON<01> is a high level. In this case, the fourth transfer gate T4 is turned on and, thus, the input signal IN is input to the first PMOS transistor P1 and the first NMOS transistor N1. Therefore, the first PMOS transistor P1 or the first NMOS transistor N1 is turned on so that the data D, the command signal C and the bank control signal BC are driven to the banks BANK0 and BANK1 with a minimum driving strength.

It is not necessary that each of the first to the fourth PMOS transistors P1 to P4 and the first to the fourth NMOS transistors N1 to N4 be of the same size. It is possible to use different sized PMOS transistors and NMOS transistors according to characteristics of each global signal skew.

For instance, let the data D, the command signal C and the bank control signal BC driven by a driving unit located near the banks BANK0 and BANK1 be the first global signal GS1 and let the data D, the command signal C and the bank control signal BC driven by a driving unit located near the banks BANK6 and BANK7 be the second global signal GS2. In this case, a delay time for the first global signal GS1 to reach the banks BANK0 and BANK1 is shorter than that for the first global signal GS1 to reach the banks BANK6 and BANK7. On the other hand, a delay time for the second global signal GS2 to reach the banks BANK6 and BAN7 is shorter than that for the second global signal GS2 to reach the banks BANK0 and BANK1.

Therefore, for solving the above-mentioned problem, in accordance with the preferred embodiment of the present invention, a driving strength of the driving unit is adjusted according to a transmission load of the global signals GS1 and GS2 by using the bank address BA<0:2>. The transmission load is determined by a distance or a resistance of the global signals GS1 and GS2.

Figure 7:
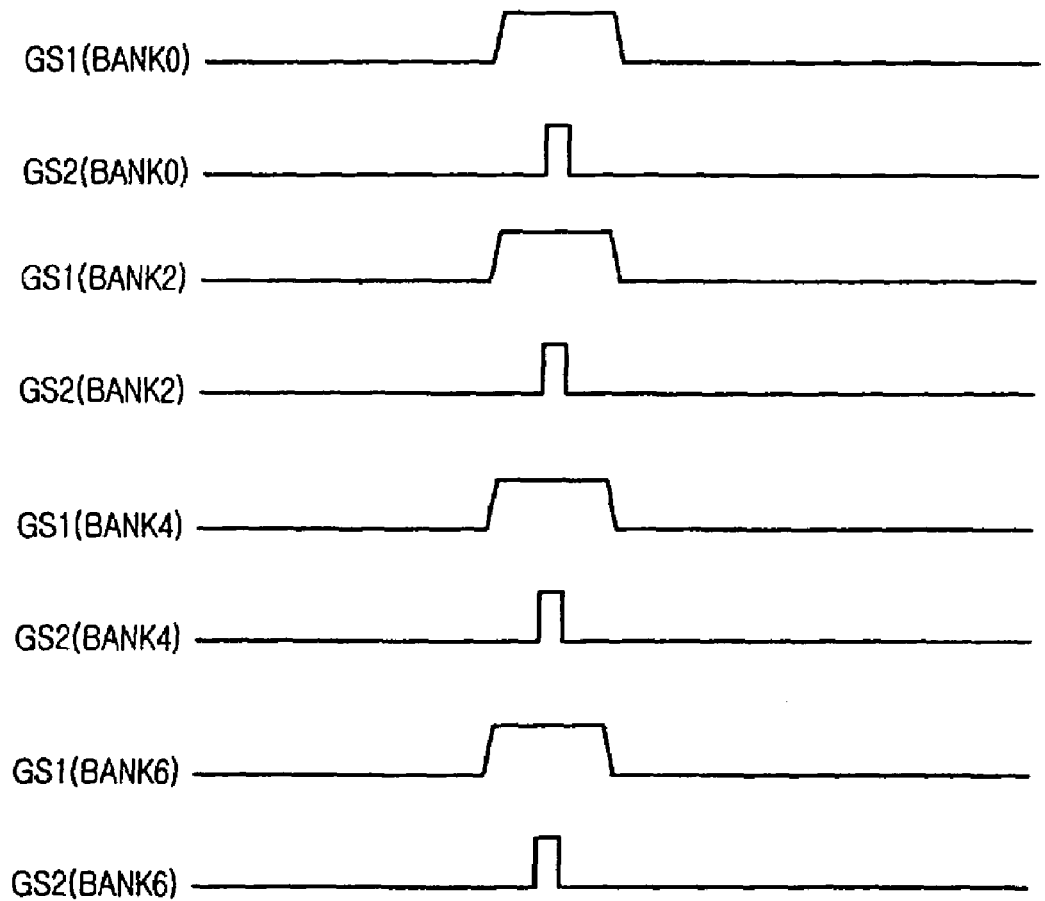
FIG. 7 is a waveform diagram for operation of the global signal driving device shown in FIG. 4.

Accordingly, if it is assumed that the second global signal GS2 should be a high level at a high level period of the first global signal GS1, even though an actual skew is larger than a simulated result, the second global signal GS2 does not deviate from the high level period of the first global signal GS1 at a bank as shown in FIG. 7.

Although the signal skews of the 8 banks are grouped into 4, assuming each group has a same skew as above-mentioned, each skew of the 8 banks can be individually controlled or the signal skews of the 8 banks can be grouped into fewer than 4. That is, regardless of the number of banks, the skews can be classified as needed.

Therefore, in accordance with the present invention, a signal skew among banks can be reduced by differently adjusting a driving strength according to a transmission load of the global signal by using the bank address.

Further, since a small size of a driver is used for driving a nearby bank and a large size of a driver is used for driving a distant bank, power consumption for driving the global signal can be reduced.

The present application contains subject matter related to Korean patent application No. 2005-91547 and 2005-124651 filed in the Korea Patent Office on Sep. 29, 2005 and Dec. 16, 2005, respectively, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A global signal driving device, comprising:
   a driving control unit configured to generate a plurality of driving control signals based on a bank address;
   a driving unit including a plurality of driving sectors to adjust a driving strength of the driving unit in response to the driving control signals, thereby selectively driving the global signal to a plurality of banks, wherein the driving strength is adjusted by activating one or more driving sectors in response to the driving control signals; and
   wherein the driving control unit generates the driving control signals differently according to a transmission load of a global signal line through which the global signal is transferred to the banks.

2. The global signal driving device as recited in claim 1, wherein the transmission load is determined by a distance to the plurality of banks or a resistance of the global signal line.

3. The global signal driving device as recited in claim 1, wherein the global signal includes one of a data signal, an address signal and a command signal.

4. The global signal driving device as recited in claim 1, wherein the driving unit drives the global signal with a first driving strength for a first transmission distance of the global signal and drives the global signal with a second driving strength which is larger than the first driving strength transmission distance of the global signal that is greater than the first transmission distance.

5. The global signal driving device as recited in claim 1, wherein the driving control unit includes:
   an inverting unit for inverting the bank address;
   a plurality of first NAND gates for generating a plurality of bank selection signals by performing a logic NAND operation to an output of the inverting unit and the bank address; and
   a plurality of second NAND gates for generating the plurality of driving control signals by performing a logic NAND operation to the plurality of bank selection signals.

6. The global signal driving device as recited in claim 1, wherein the driving unit includes:
   an inverter for inverting the global signal;
   a plurality of transfer gates for selectively output an output of the inverter by being selectively turned on according to the plurality of driving control signals; and
   the plurality of driving sectors for outputting the global signal as a different voltage value according to an output of the plurality of transfer gates.

7. The global signal driving device as recited in claim 6, wherein each of the plurality of driving sectors includes:
   a PMOS transistor; and
   an NMOS transistor,
   wherein a plurality of PMOS transistors of the driving sectors are connected in parallel to a power supply voltage gates of the plurality of PMOS transistors being selectively connected to output terminals of the plurality of transfer gates; and
   a plurality of NMOS transistors of the driving sectors are connected in parallel to a ground voltage gates of the plurality of NMOS transistors being selectively connected to the output terminals of the plurality of transfer gates.

8. The global signal driving device as recited in claim 7, wherein the number of the plurality of transfer gates is equal to the number of the plurality of PMOS transistors.

9. The global signal driving device as recited in claim 7, wherein the number of the plurality of transfer gates is equal to the number of the plurality of NMOS transistors.

10. The global signal driving device as recited in claim 7, wherein the gates of the plurality of PMOS transistors are connected to the gates of the plurality of NMOS transistors.

11. The global signal driving device as recited in claim 7, wherein the plurality of transfer gates includes:
   a first transfer gate whose output terminal is coupled to the gates of a first number of the plurality of PMOS transistors;
   a second transfer gate whose output terminal is coupled to the gates of a second number of the plurality of PMOS transistors, wherein the second number of the plurality of PMOS transistors is less than the first number of PMOS transistors;
   a third transfer gate whose output terminal is coupled to the gates of a third number of the plurality of PMOS transistors, wherein the third number of the plurality of PMOS transistors is less than the second number of PMOS transistors; and
   a fourth transfer gate whose output terminal is coupled to the gates of a fourth number of the plurality of PMOS transistors, wherein the fourth number of the plurality of PMOS transistors is less than the third number of PMOS transistors.

12. The global signal driving device as recited in claim 7, wherein the plurality of transfer gates includes:
   a fifth transfer gate whose output terminal is coupled to the gates of a first number of the plurality of NMOS transistors;
   a sixth transfer gate whose output terminal is coupled to the gates of a second number of the plurality of NMOS transistors, wherein the second number of the plurality of NMOS transistors is less than the first number of NMOS transistors fifth transfer gate;
   a seventh transfer gate whose output terminal is coupled to the gates of a third number of the plurality of NMOS transistors, wherein the third number of the plurality of NMOS transistors is less than the second number of NMOS transistors; and
   an eighth transfer gate whose output terminal is coupled to the gates of a fourth number of the plurality of NMOS transistors, wherein the fourth number of the plurality of NMOS transistors is less than the third number of NMOS transistors.

13. The global signal driving device as recited in claim 7, wherein the plurality of driving sectors activates all of the plurality of PMOS transistors and the plurality of NMOS transistors when a first driving signal is activated and activates one of the plurality of PMOS transistors and one of the plurality of NMOS transistors when a second driving signal is activated.

14. The global signal driving device as recited in claim 7, the plurality of PMOS transistors and the plurality of NMOS transistors have different sizes.

15. The global signal driving device as recited in claim 11, wherein the fourth number is one.

16. The global signal driving device as recited in claim 12, wherein the fourth number is one.

* * * * *